United States Patent [19]

Lee

[11] 4,365,211

[45] Dec. 21, 1982

[54] PHASE-LOCKED LOOP WITH INITIALIZATION LOOP

[75] Inventor: Ronald L. Lee, Reno, Nev.

[73] Assignee: Westinghouse Electric Corp., Pittsburgh, Pa.

[21] Appl. No.: 202,554

[22] Filed: Oct. 31, 1980

[51] Int. Cl.$^3$ .............................................. H03L 7/10
[52] U.S. Cl. ..................... 331/11; 307/517; 329/50; 329/122; 331/14; 331/25
[58] Field of Search .................... 331/10–12, 331/14, 17, 25; 329/50, 122, 124; 455/260; 375/120

[56] References Cited

U.S. PATENT DOCUMENTS

| | | |
|---|---|---|
| 3,241,084 | 3/1966 | Klingberg ............................ 331/111 |
| 3,447,084 | 5/1969 | Haner et al. . | 
| 3,660,781 | 5/1972 | Tewksbury et al. ............. 331/11 X |
| 3,716,802 | 2/1973 | Muratani et al. ....................... 331/8 |
| 3,909,735 | 9/1975 | Anderson et al. .................. 329/122 |
| 4,069,462 | 1/1978 | Dunn ..................................... 331/11 |
| 4,117,420 | 9/1978 | DeConinck et al. ................. 331/17 |
| 4,125,815 | 11/1978 | Kirschner ............................... 331/8 |
| 4,135,166 | 1/1979 | Marchetti ............................. 331/14 |
| 4,205,277 | 5/1980 | Poinas .................................. 331/12 |

Primary Examiner—Siegfried H. Grimm
Attorney, Agent, or Firm—John L. DeAngelis, Jr.

[57] ABSTRACT

An integrator and a voltage controlled oscillator produce a variable frequency output signal. A primary loop is locked to an input signal and has a narrow bandwidth allowing the output signal to precisely track the input signal. An initialization loop is locked to an internally generated reference signal and has a wide bandwidth for pulling the frequency of the output signal very close to the frequency of the reference signal. Since the frequency of the reference signal is approximately equal to the frequency of the input signal the initialization loop pulls the frequency of the output signal very close to the frequency of the input signal thus assuring locking of the primary loop. A switch selectively connects components of the primary loop to the integrator when the frequency difference between the reference signal and the output signal is small and connects components of the initialization loop to the integrator when the frequency difference between the reference signal and the output signal is large.

15 Claims, 4 Drawing Figures

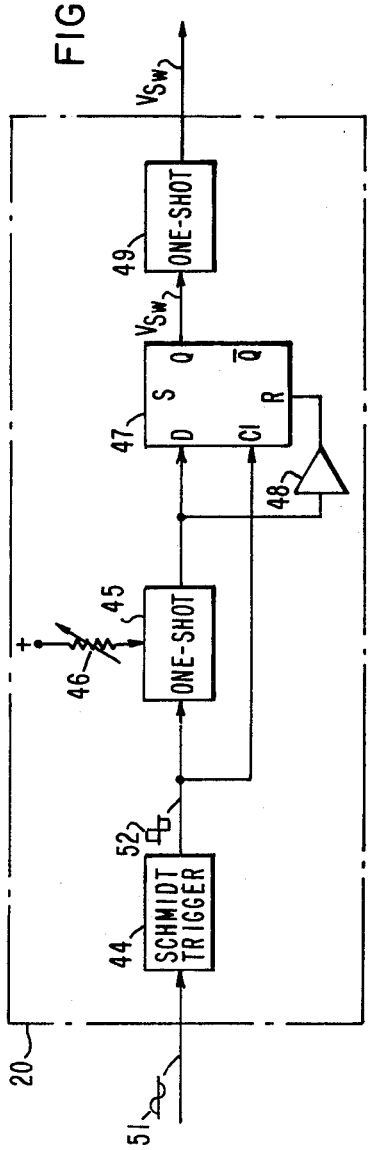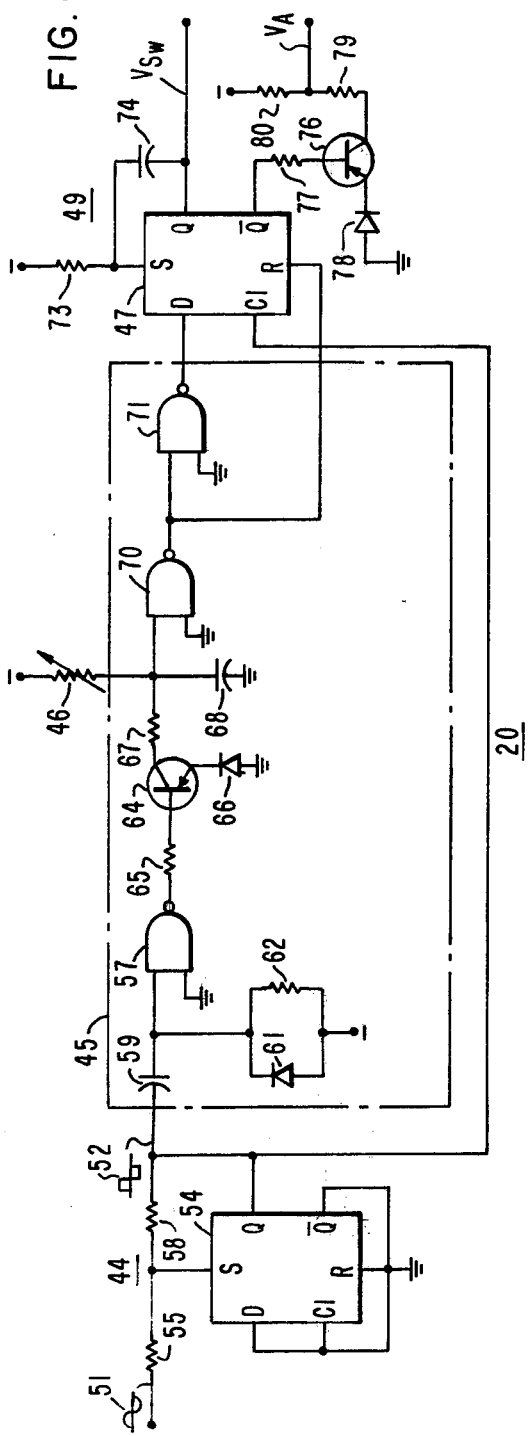

PHASE-LOCKED LOOP WITH INITIALIZATION LOOP

BACKGROUND OF THE INVENTION

1. Field of the Invention

This invention is related generally to phase-locked loops and specifically to phase-locked loops having components for assuring initial lock to an incoming signal.

2. Description of the Prior Art

There are many applications where it is desirable to synchronize, or lock, the phase and frequency of a locally produced signal to the phase and frequency of a received signal. For example, such synchronization is required for the demodulation of single sideband signals. The required synchronization may be obtained by using a phase-locked loop, hereinafter PLL.

A PLL is typically comprised of a phase detector, a low-pass filter, an amplifier, and a voltage controlled oscillator, hereinafter VCO. The phase detector compares the phase of an input signal to the phase of a variable frequency output signal which is produced by the VCO. The phase detector produces an output voltage that is representative of the instantaneous difference between the input signal and the output signal. The output voltage of the phase detector is filtered, amplified and input to the VCO. The frequency of the output signal produced by the VCO varies with the voltage input thereto, which voltage is representative of the phase difference between the input signal and the output signal. In this manner the phase and frequency of the output signal is locked to the phase and frequency of the input signal.

In designing a PLL the bandwidth chosen must be a compromise between competing design criteria. It is desirable to have a wide bandwidth thus allowing for initial synchronization, or capture, over a wide range of frequencies. However, a wide bandwidth will have poor noise rejection characteristics and thus the output signal may not precisely track the input signal. In order to increase the precision with which the output signal tracks the input signal it is necessary to decrease the bandwidth. This decrease in bandwidth will, however, reduce the capture range of the PLL. Thus, the bandwidth chosen for the typical PLL must be a compromise between a wide bandwidth allowing for fast acquisition over a wide range of frequencies and a narrow bandwidth allowing for noise-free tracking of the input signal.

One prior art technique for avoiding this compromise is to have two loops responsive to the received signal. One loop has a large bandwidth for fast acquisition over a wide range of frequencies; the second loop has a narrow bandwidth for error-free tracking. A switch, responsive to the difference between the input signal and the output signal, determines which loop is connected to the VCO. When the difference is large, the loop having the large bandwidth is connected to the VCO. Conversely, when the difference is small, the loop having the narrow bandwidth is connected to the VCO.

SUMMARY OF THE INVENTION

The present invention is a phase-locked loop having an initialization loop for initially pulling the frequency of an output signal very close to the frequency of an input signal such that locking is assured. An integrator and a voltage controlled oscillator produce the variable frequency output signal and are common components to both a first and a second loop. The first, or primary, loop has a narrow bandwidth and is locked to the input signal. The first loop compares the input signal to the variable frequency output signal. A second, or initialization, loop has a wide bandwidth and is locked to a reference signal. The second loop compares the reference signal to the variable frequency output signal. The reference signal has a frequency approximately equal to the frequency of the input signal. An off-frequency detector is responsive to the comparison of the reference signal to the output signal and produces a switching control signal representative of this comparison. A switch selectively connects the remainder of the components of one of the first loop and the second loop to the integrator and the voltage controlled oscillator. The switch is responsive to the switching control signal such that the components of the first loop are connected to the integrator and the voltage controlled oscillator when the difference between the reference signal and the output signal is small and the components of the second loop are connected to the integrator and the voltage controlled oscillator when the difference between the reference signal and the output signal is large.

BRIEF DESCRIPTION OF THE DRAWINGS

FIG. 1 is a block diagram of a phase-locked loop constructed according to the teachings of the present invention;

FIG. 2 is a block diagram of a circuit utilizing a phase-locked loop constructed according to the teachings of the present invention to recover an informational signal from a received signal;

DESCRIPTION OF THE PREFERRED EMBODIMENT

Figures 1, 2:
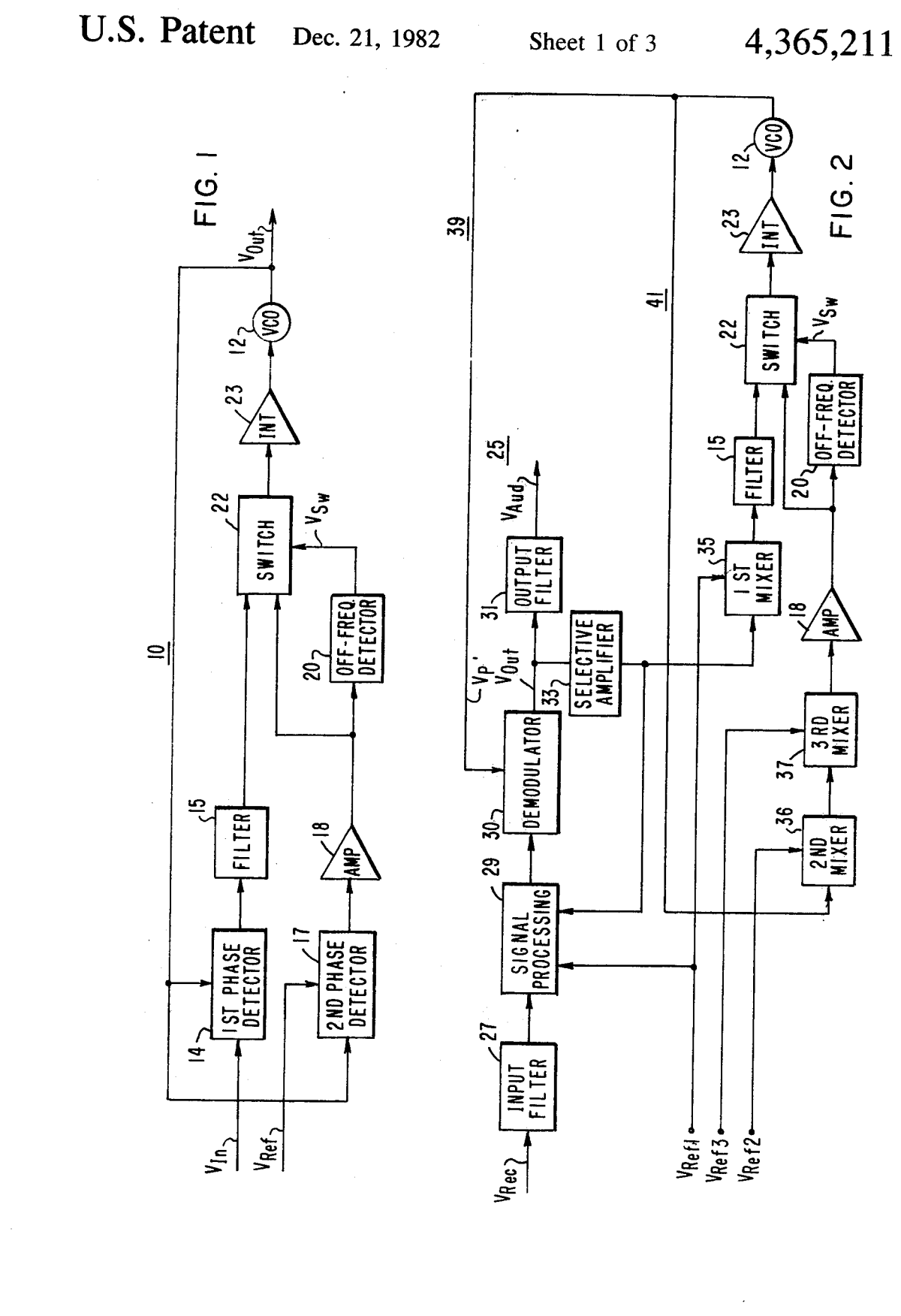
Figure 3:
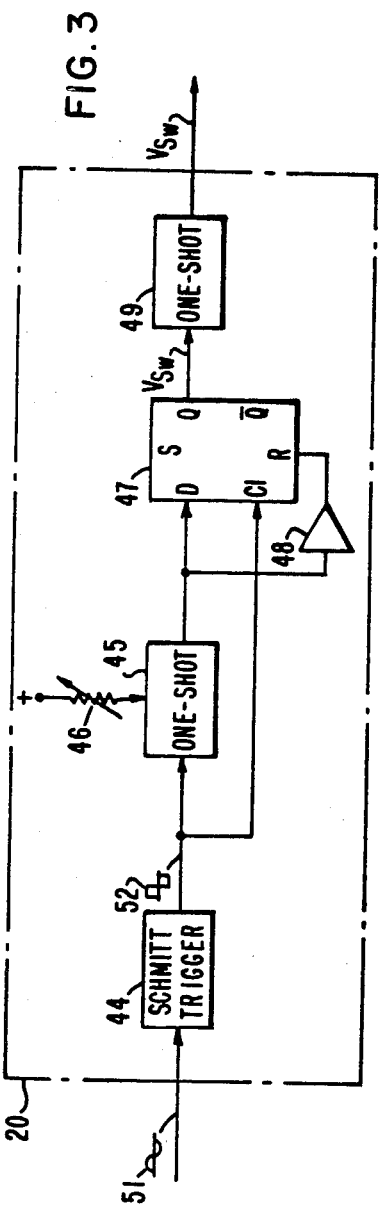
FIG. 3 is a block diagram of the off-frequency detector.

FIG. 1 illustrates a block diagram of a simplified phase-locked loop 10 having an initialization loop for assuring locking. The phase-locked loop 10 produces a variable frequency output signal $V_{Out}$ which is locked in phase and frequency to an input signal $V_{In}$. The output signal $V_{Out}$ is produced by a voltage controlled oscillator (VCO) 12. The frequency of the output signal $V_{Out}$ is determined by the magnitude of the voltage input to the VCO 12. The output signal $V_{Out}$ is fed back to a first phase detector 14. The first phase detector 14 compares the phase of the output signal $V_{Out}$ to the phase of the input signal $V_{In}$. A filter 15 is responsive to the first phase detector 14.

The output signal $V_{Out}$ is also fed back to a second phase detector 17. The second phase detector 17 compares the phase of the output signal $V_{Out}$ to the phase of an internally generated reference signal $V_{Ref}$. The reference signal $V_{Ref}$ has a frequency approximately equal to the frequency of the input signal $V_{In}$. An amplifier 18, having a large bandwidth, is responsive to the second phase detector 17. An off-frequency detector 20 is responsive to the amplifier 18. The off-frequency detector 20 produces a switching control signal $V_{Sw}$ which is responsive to the frequency difference between the frequency of the output signal $V_{Out}$ and the frequency of the reference signal $V_{Ref}$.

A switch 22 selectively connects both the filter 15 and the amplifier 18 to an integrator 23. The switch 22 is responsive to the switching control signal $V_{Sw}$ such that the filter 15 is connected to the integrator 23 when the frequency difference between the output signal $V_{Out}$ and the reference signal $V_{Ref}$ is small and the amplifier 18 is connected to the integrator 23 when the frequency difference between the output signal and the reference signal is large. The integrator 23 produces a control voltage which is input to the VCO 12. In this manner the second phase detector 17, the amplifier 18 and the integrator 23 are used to pull the output signal $V_{Out}$ within a given range of the reference signal $V_{Ref}$ as determined by the off-frequency detector 20; the first phase detector 14, the filter 15, and the integrator 23 allow the output signal $V_{Out}$ to precisely track the input signal $V_{In}$ after the output signal has been pulled within the range determined by the off-frequency detector 20.

The operation of the present invention may be more clearly understood by discussing its operation in conjunction with a particular application. One such application is illustrated in FIG. 2 wherein a block diagram of a single sideband receiver circuit 25 utilizing a phase-locked loop constructed according to the teachings of the present invention for the recovery of an informational signal from a received signal $V_{Rec}$ is shown. It is to be understood that the present invention is not limited to this particular application. Where appropriate, identical components performing identical functions will have the same reference numeral as assigned in FIG. 1.

In FIG. 2 the received signal $V_{Rec}$ is input to an input filter 27. The received signal $V_{Rec}$ is typically composed of a data signal $V_D$ occupying a discrete frequency spectrum and a pilot tone $V_P$ having a frequency adjacent to the frequency spectrum of the data signal. The filtered, received signal $V_{Rec}$ is input to a signal processing circuit 29. The signal processing circuit 29 may be of a type described in U.S. patent application Ser. No. 202,553 filed Oct. 31, 1980 wherein the frequencies of the data signal $V_D$ and the pilot tone $V_P$ are translated to predetermined intermediate frequencies. The intermediate frequency pilot tone is then separated by filters from the intermediate frequency data signal. The frequency of the intermediate frequency pilot tone is translated to a frequency sufficiently removed from the frequency spectrum of the intermediate frequency data signal so as not to interfere therewith. Both the intermediate frequency data signal and the translated, intermediate frequency, pilot tone are amplified in an automatic gain controlled amplifier. The output signal of the amplifier corresponds to the output signal of the signal processing circuit 29 shown in FIG. 2.

The output signal of the signal processing circuit 29 is input to a demodulator 30. The demodulator 30 also receives a regenerated pilot tone $V_P'$. The demodulator produces an output signal $V_{Out}$ which is composed of both an audio output signal $V_{Aud}$ corresponding to the received data signal $V_D$ and a recovered pilot tone corresponding to the received pilot tone $V_P$. The output signal $V_{Out}$ is input to an output filter 31 which passes the audio output signal $V_{Aud}$ thus conveying the desired information to the user.

The output signal $V_{Out}$ of the demodulator 30 is input to both the signal processing circuit 29 (for automatic gain control) and a first mixer, or phase detector, 35 through a selective amplifier 33. The selective amplifier 33 acts as a filter as well as a buffer. The first mixer 35 additionally receives a first reference signal $V_{Ref1}$. An output signal of the first mixer 35 represents the phase difference between the recovered pilot tone and the reference signal $V_{Ref1}$. This output signal is input to the filter 15. The filter 15 is selectively connected to the integrator 23 by the switch 22. The integrator 23 produces the control voltage which is input to the voltage controlled oscillator 12. The voltage controlled oscillator 12 produces the regenerated pilot tone $V_P'$ which is input to the demodulator 30.

The regenerated pilot tone $V_P'$ is additionally input to a second mixer, or phase detector, 36. The second mixer 36 also receives a second reference signal $V_{Ref2}$. An output signal of the second mixer 36 is input to a third mixer, or phase detector, 37. A third reference signal $V_{Ref3}$ is input to the third mixer 37. An output signal of the third mixer 37 is amplified by the amplifier 18. The amplifier 18 is selectively connected by the switch 22 to the integrator 23. The off-frequency detector 20 is responsive to the amplifier 18 and produces the switching control signal $V_{Sw}$ which controls the operation of the switch 22.

In FIG. 2, the demodulator 30, the first mixer 35, the filter 15, the switch 22, the integrator 23, and the oscillator 12 form a loop 39 which acts as both a translation loop and a pilot regeneration loop. The second mixer 36, the third mixer 37, the amplifier 18, the switch 22, the integrator 23, and the oscillator 12 form an initialization loop 41. In a typical communications system both the intermediate frequency pilot tone and the translated, intermediate frequency, pilot tone have predetermined frequencies. For example, the pilot tone has a frequency of 5.2 megahertz and the translated, intermediate frequency, pilot tone has a frequency of 4.783 megahertz. At these high intermediate frequencies if the voltage controlled oscillator 12 has a stability of 0.05% the regenerated pilot tone $V_P'$ could be as much as 2.6 kilohertz off frequency. With such a large error the translation and regeneration loop 39 will never achieve phase lock. The initialization loop 41 is therefore necessary to pull the voltage controlled oscillator 12 within the locking range of the translation and regeneration loop 39.

Since the frequency of the intermediate frequency pilot tone $V_P$ is known, i.e. 5.2 megahertz in our example, the frequency of the regenerated pilot tone $V_P'$ may be compared by the initialization loop 41 to a reference signal having a frequency approximately that of the known frequency of the translated, intermediate frequency, pilot tone. Because an internally generated reference signal is used by the initialization loop 41 to pull the oscillator 12 within the locking range of the translation and regeneration loop 39 initial locking will occur quickly no matter what the frequency of the regenerated pilot tone $V_P'$ is initially. In our example, the regenerated pilot tone $V_P'$ is compared by the second mixer 36 to the second reference signal $V_{Ref2}$ which has a frequency of five megahertz. The resulting signal is compared by the third mixer 37 to the third reference signal $V_{Ref3}$ having a frequency of 0.2 megahertz. If the regenerated pilot tone $V_P'$ has a frequency of 5.2 megahertz the resulting output signal of the third mixer 37 will have a frequency of zero. The off-frequency detector 20 will determine that the frequency of the regenerated pilot tone $V_P'$ is within the capture range of the translation and regeneration loop 41. The off-frequency detector 20 will cause the switch 22 to connect the filter 15 to the integrator 23. The off-frequency detector 20 may be adjusted by the user to determine a "window of acceptability" for the frequency of the regenerated pilot tone $V_{P'}$. A typical window of acceptability would allow the frequency of the regenerated pilot tone $V_{P'}$ to vary by fourteen hertz above or below the 5.2 megahertz value.

Concluding our example, when the regenerated pilot tone $V_{P'}$ is within the window of acceptability, the recovered pilot tone, which is a portion of the output signal $V_{Out}$, will have a frequency of 417 kilohertz ± 14 hertz depending upon the exact frequency of the regenerated pilot tone $V_{P'}$. The recovered pilot tone is compared by the first mixer 35 to the first reference signal $V_{Ref1}$ which has a frequency of 417 kilohertz. The resulting output signal of the first mixer 35 is representative of the tracking error between the regenerated pilot tone $V_{P'}$ and the translated, intermediate frequency, pilot tone. The output signal of the first mixer 35 is filtered and integrated by the filter 15 and the integrator 23, respectively, before being input to the voltage controlled oscillator 12. If the frequency of the regenerated pilot tone should fall outside of the window of acceptability the off-frequency detector will cause the switch 22 to disconnect the filter 15 from the integrator 23 and connect the amplifier 18 to the integrator 23. The initialization loop 41 will again pull the oscillator 12 within the locking range of the translation and regeneration loop 39. This concludes the discussion of FIG. 2.

The off-frequency detector 20 is considered to be an important feature of the present invention and is shown in block diagram form in FIG. 3. A Schmitt trigger 44 is responsive to the output signal of the amplifier 18 which is shown in FIG. 3 as a sine wave 51. A one-shot multivibrator 45 is responsive to the output signal of the Schmitt trigger 44 which is shown as a square wave 52. The one-shot multivibrator 45 is connected to a positive voltage source through an adjustable resistor 46. A D-type flip-flop 47 has a set terminal S, a D input terminal responsive to the one-shot 45, a clock C1 input terminal responsive to the Schmitt trigger 44, a reset terminal R connected to the one-shot 45 through an inverter 48, a $\overline{Q}$ output terminal, and a Q output terminal. The Q output terminal of the flip-flop 47 produces the switching signal $V_{Sw}$ which is input to a second one-shot multivibrator 49. An output signal of the second one-shot multivibrator 49 is also the switching signal $V_{Sw}$.

The Schmitt trigger 44 is responsive to the sine wave 51. The sine wave 51 is produced by the second phase detector 17 shown in FIG. 1 and has a frequency representative of the difference between the frequency of the output signal $V_{Out}$ and the frequency of the reference signal $V_{Ref}$. The Schmitt trigger 44 produces the square wave 52 which has a frequency responsive to the frequency of the sine wave 51.

The square wave 52 is input to the one-shot multivibrator 45. A one-shot is a circuit which produces an output signal of fixed duration when an input signal of any duration is applied. The time period of the square wave 52 is compared to the time period of an output signal of the one-shot 45. If the time period of the square wave 52 is shorter than the time period of the output signal of the one-shot 45, output signal will remain in a high state. Conversely, if the time period of the square wave 52 is longer than the time period of the output signal of the one-shot 45, the output signal will vary from a high to a low state. The time period of the output signal of the one-shot 45 may be varied by adjusting the resistance value of the adjustable resistor 46. The value of the resistor 46 determines the window of acceptability for the off-frequency detector 20. Increasing the value of the resistor 46 decreases the window of acceptability. Conversely, decreasing the value of the resistor 46 increases the window of acceptability.

The flip-flop 47 will clock the high state of the output signal from the one-shot 45 from the D input terminal to the Q output terminal on each positive going transition from the Schmitt trigger 44. This results in the switching control signal $V_{Sw}$ being available at the Q output terminal. The inverter 48 between the one-shot 45 and the reset terminal R of the flip-flop 47 eliminates hangup of the off-frequency detector 20 in the situation where the frequency of the sine wave 51 is high, and immediately goes to zero, as might happen if the initialization loop locks very quickly. If the initialization loop locks very quickly the output signal of the one-shot 45 goes low and the flip-flop 47 must be reset since there are no positive going transitions in the square wave 52 to clock the flip-flop 47.

Figure 4:
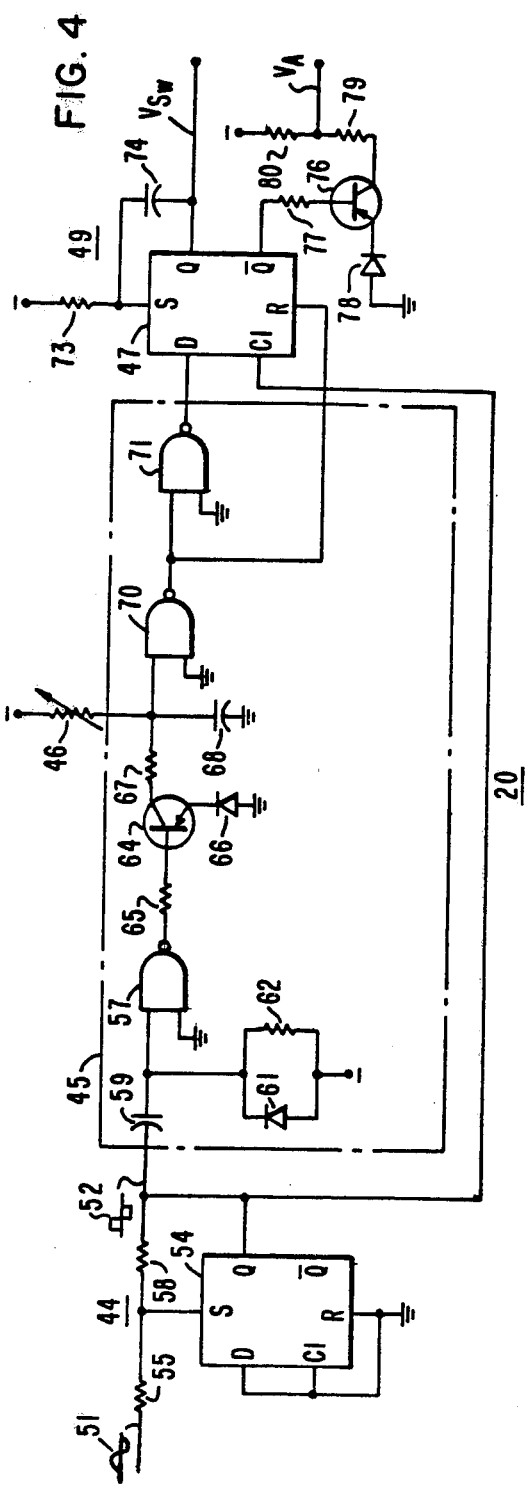
FIG. 4 is an electrical schematic of the off-frequency detector illustrated in FIG. 3.

The second one-shot 49 delays the switching control signal $V_{Sw}$ thus insuring that the initialization loop is given sufficient time to completely lock to the reference signal $V_{Ref}$. The circuit details of the off-frequency detector 20 are shown in FIG. 4. The circuit shown in FIG. 4 uses positive logic and a positive ground, i.e., ground potential is a logic one. Turning to FIG. 4 the sine wave 51 is input to a set terminal S of a flip-flop 54 through a resistor 55. A D input terminal, a clock input terminal C1, and a reset terminal R are all connected to ground. The set terminal S of the flip-flop 54 is connected to a first input terminal of a first NAND gate 57 through the series combination of a resistor 58 and a capacitor 59. The junction between the resistor 58 and the capacitor 59 is connected to a Q output terminal of the flip-flop 54. The square wave 52 is available at the Q output terminal. The flip-flop 54 and associated resistors provide the function of the Schmitt trigger 44 shown in FIG. 3.

The first input terminal of the NAND gate 57 is connected to a negative voltage source through the parallel combination of a diode 61 and a resistor 62. A second input terminal of the NAND gate 57 is connected to ground. An output terminal of the NAND gate 57 is connected to a base terminal of a transistor 64 through a resistor 65. An emitter terminal of the transistor 64 is connected to ground through a diode 66. A collector terminal of the transistor 64 is connected to a negative voltage source through the series combination of the adjustable resistor 46 and a resistor 67. The junction between the resistor 46 and the resistor 67 is connected to ground through a capacitor 68 and is connected to a first input terminal of a second NAND gate 70. A second input terminal of the NAND gate 70 is connected to ground. An output terminal of the NAND gate 70 is connected to both a first input terminal of a third NAND gate 71 and the reset terminal R of the flip-flop 47. A second input terminal of the third NAND gate 71 is connected to ground. An output terminal of the third NAND gate 71 is connected to the D input terminal of the flip-flop 47. The NAND gates 57, 70 and 71 together with the transistor 64 and the associated components provide the function of the one-shot 45 shown in FIG. 3 as indicated by the broken line.

The clock input terminal C1 of the flip-flop 47 is connected to the Q output terminal of the flip-flop 54. The set terminal S of the flip-flop 47 is connected to a negative voltage source through a resistor 73. The set terminal S of the flip-flop 47 is also connected to the Q output terminal thereof through a capacitor 74. The switching signal $V_{Sw}$ is available at the Q output terminal of the flip-flop 47.

The capacitor 74 provides an AC coupled, positive feedback voltage to the set terminal S of the flip-flop 47. The capacitor causes the signal input to the set terminal S to remain high until the capacitor 74 has discharged. This causes the switching signal $V_{Sw}$ to remain high for a fixed duration. Thus, the combination of the flip-flop 47 and the capacitor 74 provide the function of the one-shot 49 shown in FIG. 3.

Concluding the description of FIG. 4, the $\overline{Q}$ output terminal of the flip-flop 47 is connected to a base terminal of a transistor 76 through a resistor 77. An emitter terminal of the transistor 76 is connected to ground through a diode 78. A collector terminal of the transistor 76 is connected to a negative voltage source through the series combination of a resistor 79 and a resistor 80. An off-frequency alarm signal $V_A$ is available at the junction between the resistors 79 and 80. The off-frequency alarm signal $V_A$ is delayed by the transistor 76 such that an off-frequency condition must exist for a predetermined period of time prior to the production of the off-frequency alarm signal $V_A$. The signal $V_A$ may be used to provide an appropriate audio or visual alarm.

Briefly reviewing, a phase-locked loop is disclosed having a first loop locked to an incoming signal and a second loop locked to an internally generated reference signal. The first loop has a narrow bandwidth for error-free tracking of the input signal while the second loop has a wide bandwidth to assure initial locking. An off-frequency detector and a switch determine whether the first or second loop is engaged.

What I claim is:

1. A phase-locked loop producing an output signal having a frequency locked to the frequency of an input signal, comprising:
    means for producing the input signal;
    means for producing the output signal, said output signal having a variable frequency;
    first means for detecting a phase difference between said input signal and said output signal, said first phase detection means having a narrow bandwidth;
    means for producing a reference signal;
    second means for detecting a phase difference between said reference signal and said output signal, said second phase detection means having a wide bandwidth;
    control means responsive to said second phase detection means, said control means producing a switching signal representative of the frequency difference between said reference signal and said output signal;
    and switching means selectively connecting one of said first phase detection means and said second phase detection means to said means producing said output signal, said switching means being responsive to said switching signal such that when said frequency difference between said reference signal and said output signal is large said second phase detection means is connected to said means producing said output signal.

2. The phase-locked loop of claim 1 wherein the frequency of the reference signal is approximately equal to the frequency of the input signal.

3. The phase-locked loop of claim 1 wherein the means for producing the output signal includes an integrator, and includes a voltage controlled oscillator responsive to said integrator.

4. The phase-locked loop of claim 1 wherein the first phase detection means includes a first mixer and wherein the second phase detection means includes a second mixer.

5. The phase-locked loop of claim 1 including a filter responsive to the first phase detection means.

6. The phase-locked loop of claim 1 including an amplifier responsive to the second phase detection means.

7. The phase-locked loop of claim 1 wherein the control means includes a Schmitt trigger responsive to the second phase detection means, and includes an adjustable monostable multivibrator responsive to said Schmitt trigger, and includes a D-type flip-flop having a D input terminal responsive to said multivibrator, a clock input terminal responsive to said Schmitt trigger, and a reset input terminal responsive to said multivibrator, and an output terminal producing the switching signal.

8. The phase-locked loop of claim 7 including means for delaying the switching signal.

9. The phase-locked loop of claim 8 wherein the means for delaying includes a capacitor connected between the output terminal and a set input terminal of the flip-flop, said set input terminal further connected to a negative voltage source.

10. The phase-locked loop of claim 1 wherein the second phase detection means is connected to the means producing the output signal in response to the frequency difference between the reference signal and the output signal being greater than fourteen hertz.

11. A phase-locked loop for recovering an informational signal from a received signal, comprising:
    means for producing a regenerated pilot tone;
    demodulation means responsive to both the received signal and said regenerated pilot tone, said demodulation means recovering both the informational signal and a recovered pilot tone from said received signal;
    first means for detecting a phase difference between said recovered pilot tone and a first reference signal;
    filtering means responsive to said first phase detection means;
    second means for detecting a phase difference between a second reference signal and said regenerated pilot tone, said second phase detection means having a wide bandwidth;
    control means responsive to said second phase detection means, said control means producing a switching signal representative of the frequency difference between said second reference signal and said regenerated pilot tone;
    and switching means selectively connecting one of said means for filtering and said second phase detection means to said means producing said regenerated pilot tone, said switching means responsive to said switching signal such that when said frequency difference between said second reference signal and said regenerated pilot tone is large said second phase detection means is connected to said means producing said regenerated pilot tone.

12. The phase-locked loop of claim 11 wherein the demodulation means includes a quadrature oscillator.

13. The phase-locked loop of claim 11 wherein the second phase detection means includes a first mixer responsive to both the second reference signal and the regenerated pilot tone, and includes a second mixer responsive to both said first mixer and a third reference signal.

14. The phase-locked loop of claim 11 wherein the regenerated pilot tone has a frequency of 5.2 megahertz.

15. The phase-locked loop of claim 11 including means producing an off-frequency alarm signal, said means responsive to the switching signal.

* * * * *